Figure 1:
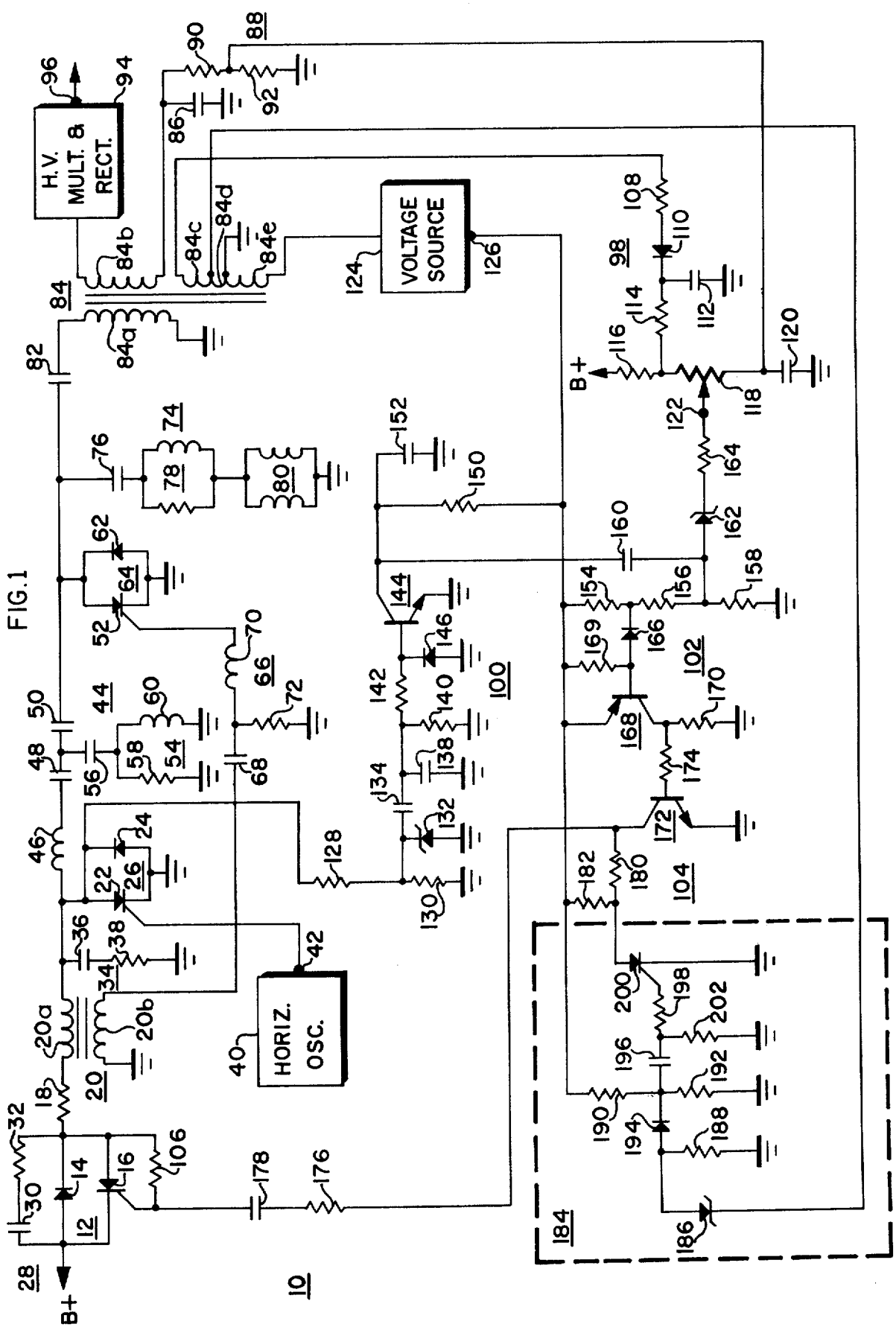

United States Patent [19]

Böhringer

[11] 4,009,426
[45] Feb. 22, 1977

[54] VOLTAGE REGULATOR FOR A DEFLECTION SYSTEM

[75] Inventor: Walter Böhringer, Schlieren, Switzerland

[73] Assignee: RCA Corporation, New York, N.Y.

[22] Filed: July 10, 1975

[21] Appl. No.: 594,899

[30] Foreign Application Priority Data

May 16, 1975 United Kingdom ............ 20868/75

[52] U.S. Cl. .................................. 315/408; 315/387
[51] Int. Cl.² .................. H01J 29/70; H01J 29/76
[58] Field of Search .......... 315/411, 408, 387, 388; 307/252 J

[56] References Cited

UNITED STATES PATENTS

| | | | |
|---|---|---|---|
| 3,221,269 | 11/1965 | Davies | 315/387 |
| 3,447,031 | 5/1969 | Jenks | 307/252 J |
| 3,501,650 | 3/1970 | Phoenix | 307/252 J |
| 3,858,084 | 12/1974 | Manners | 315/387 |
| 3,919,599 | 11/1975 | Reh et al. | 315/411 |
| 3,936,115 | 2/1976 | Dietz | 315/399 |

Primary Examiner—Maynard R. Wilbur
Assistant Examiner—T. M. Blum
Attorney, Agent, or Firm—Eugene M. Whitacre; Paul J. Rasmussen

[57] ABSTRACT

A voltage regulator for a thyristor deflection system of the commutating network type includes a reverse current control network which couples a source of direct current to the commutating network. The reverse current control network includes a diode which provides for energy transfer from the source of direct current to the commutating network during a first portion of the energy storage interval and a silicon controlled rectifier (SCR) which provides for energy transfer from the commutating network to the source of direct current during a second portion of the energy storage interval after the SCR is enabled. A resistor coupled between the gate and anode electrodes of the SCR provides a gate current for enabling the conduction of the SCR. A disabling network coupled between the deflection system high voltage transformer and the gate of the SCR provides for the diversion of the gate current produced by the resistor for an interval determined by the level of signals produced by the high voltage transformer to control conduction time of the SCR and thereby regulate the voltage in the commutating network.

12 Claims, 12 Drawing Figures

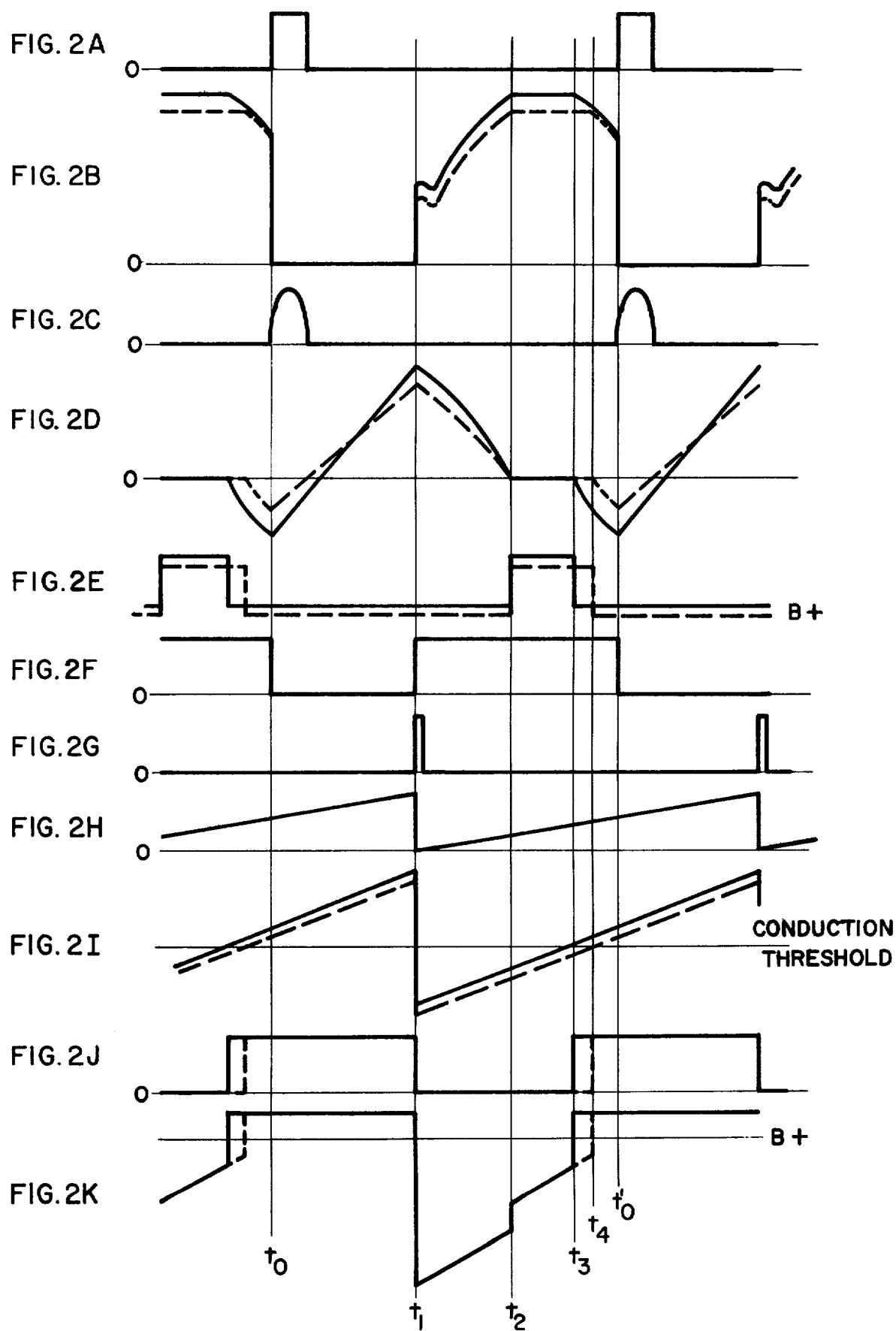

VOLTAGE REGULATOR FOR A DEFLECTION SYSTEM

BACKGROUND OF THE INVENTION

This invention relates to a voltage regulator for a deflection system.

In a horizontal deflection system such as disclosed in U.S. Pat. No. 3,452,244 issued June 24, 1969, to W. F. W. Dietz and entitled, "Electron Beam Deflection and High Voltage Generation Circuit", two bidirectionally conducting switches serve to respectively commutate energy stored in a commutating network and provide scanning current to a horizontal deflection winding. Each switch comprises a silicon controlled rectifier (SCR) and an oppositely poled diode connected in parallel therewith. Due to the reactive components connected in circuit with these switches, there are relatively high voltages appearing across these switches when they are open during each deflection cycle. This peak voltage across the switch stresses the SCR and the SCR must be designed to prevent breakdown under peak voltage conditions. It follows that the SCR devices utilized in the deflection system could be made less expensive and the deflection system could be made more reliable if the peak voltage across the devices could be controlled or limited. Also, failure of the voltage regulator should result in a minimum rather than a maximum output from the high voltage transformer.

SUMMARY OF THE INVENTION

A voltage regulator for a deflection system including a commutating network for storing energy during an energy storage interval of each deflection cycle and for supplying the stored energy to a deflection winding and a high voltage transformer during a commutating interval of each deflection cycle comprises unidirectional current conducting means coupled to a direct current source and the commutating network for providing a path for current flow in a first direction between the direct current voltage source and the commutating network during a first portion of the energy storage interval. Controllable unidirectional current conducting means coupled to the direct current voltage source and the commutating network provides a path for current flow in a second direction between the direct current voltage source and the commutating network during a second portion of the energy storage interval after a predetermined level of current flows into a gate electrode of the controlled unidirectional current conducting means. Enabling means coupled to the gate electrode provides the predetermined level of gate current during the second portion of the energy storage interval. Disabling means coupled to the deflection system and the gate electrode diverts the predetermined level of gate current away from the gate electrode for an interval determined by a level of signals produced by the high voltage transformer thereby maintaining a substantially constant level of signals produced by the high voltage transformer from one deflection cycle to another.

A more detailed description of a preferred embodiment of the invention is given in the following detailed description and accompanying drawings of which:

FIG. 1 is a schematic diagram, partially in block form, of a deflection system embodying the invention; and FIGS. 2A–2K are normalized waveforms obtained at various points in the schematic diagram of FIG. 1.

DESCRIPTION OF THE INVENTION

FIG. 1 is a schematic diagram, partially in block form, of a deflection system 10. A source of direct current voltage (B+) is coupled to a reverse current control network 12 comprising a diode 14 and a silicon controlled rectifier (SCR) 16 coupled in antiparallel combination. The anode electrode of diode 14 and the cathode electrode of SCR 16 are coupled to B+, and the cathode electrode of diode 14 and the anode electrode of SCR 16 are coupled through a series combination of a current limiting resistor 18 and a winding 20a of an input reactor 20 to the anode electrode of an SCR 22 and the cathode electrode of a damper diode 24. The cathode electrode of SCR 22 and the anode electrode of diode 24 are coupled to reference potential. The SCR 22 and the diode 24 form a commutating switch 26. A damping network 28 coupled in parallel with reverse current control network 12 includes a series combination of a capacitor 30 and a resistor 32. A damping network 34 coupled in parallel with the commutating switch 26 includes a series combination of a capacitor 36 and a resistor 38. The gate electrode of SCR 22 is coupled to a horizontal oscillator 40 which generates gating pulses at an output terminal 42 as shown in FIG. 2A.

A commutating network 44 includes a commutating coil 46, a first commutating capacitor 48 and a second commutating capacitor 50 in series combination and coupled between the anode electrode of SCR 22 and the anode electrode of an SCR 52. The junction of capacitors 48 and 50 is coupled through an auxiliary capacitor 56 to a radio frequency interference (RFI) suppression network 54 including resistor 58 and inductor 60 to reference potential.

The potential electrode of SCR 52 is coupled to reference potential. A damper diode 62 is coupled in antiparallel combination with SCR 52 to form a trace switch 64. A winding 20b of input reactor 20 has a first terminal coupled to reference potential and a second terminal coupled through a waveshaping network 66 to the gate electrode of SCR 52. The waveshaping network 66 includes a capacitor 68 and an inductor 70 in series combination between the second terminal of winding 20b and the gate electrode of SCR 52. The junction of capacitor 68 and inductor 70 is coupled to reference potential by means of a resistor 72.

A deflection network 74 including a series combination of an S-shaping capacitor 76, a linearity network 78 and a deflection winding 80 are coupled in parallel with SCR 52. A capacitor 82 in series combination with a primary winding 84a of a high voltage transformer 84 is coupled in parallel with SCR 52.

A winding 84b has a first terminal coupled to reference potential by means of an alternating current bypass capacitor 86 in parallel combination with a voltage divider 88 including a resistor 90 and a resistor 92 in series combination. A second terminal of winding 84b is coupled to a high voltage multiplier and rectifier 94. The high voltage multiplier and rectifier 94 processes voltage pulses developed by winding 84b to develop a high voltage direct current potential at output terminal 96 which is coupled to the ultor electrode of a kinescope tube (not shown). Current flow out of terminal 96 develops a negative voltage at the junction of resistors 90 and 92.

A voltage regulator which provides for maintaining substantially constant level signals produced by the high voltage transformer 84 from one deflection cycle to another includes a bias network 98, a ramp generator 100, a threshold network 102, a disabling network 104 and an enabling resistor 106.

A first terminal of a winding 84c of high voltage transformer 84 which produces pulses as shown in FIG. 2C is coupled through a current limiting resistor 108, a diode 110, and a filter capacitor 112 to reference potential. The other terminal of winding 84c is coupled through winding 84d to reference potential. The cathode of diode 110 is coupled through a series combination of a resistor 114 and a resistor 116 to B+. The junction of resistors 114 and 116 is coupled through the resistive element of a variable resistor 118 and a filter capacitor 120 to reference potential. The junction of the resistive element of potentiometer 118 and capacitor 120 is coupled to the junction of resistors 90 and 92. The wiper terminal 122 of potentiometer 118 provides a bias which is directly proportional to the level of B+ and the pulse amplitude of the signal appearing at the first terminal of winding 84c and inversely proportional to the current being supplied by the high voltage multiplier and rectifier 94.

A first terminal of winding 84e is coupled to a voltage source 124 which provides a regulated direct current voltage at an output terminal 126 when the deflection system 10 is energized. The other terminal of winding 84e is coupled to reference potential.

A series combination of a resistor 128 and a resistor 130 is coupled in parallel with SCR 22. The junction of resistors 128 and 130 is coupled to the cathode electrode of a zener diode 132. The anode of zener diode 132 is coupled to reference potential. The junction of resistors 128 and 130 is also coupled through a differentiating network comprising a capacitor 134 in series combination with a capacitor 138 and a resistor 140 in parallel combination. The junction of capacitors 134 and 138 is coupled through a current limiting resistor 142 to the base electrode of a switching transistor 144. The emitter electrode of transistor 144 is coupled to reference potential. A diode 146 is coupled between the base electrode of transistor 144 and reference potential and provides protection against reverse breakdown of the base-emitter junction of transistor 144. The collector electrode of transistor 144 is coupled through a resistor 150 to terminal 126 of voltage source 124. An integrating capacitor 152 is coupled between the collector electrode of transistor 144 and reference potential.

The series combination of a resistor 154, a resistor 156 and a resistor 158 is coupled between terminal 126 of voltage source 124 and reference potential. The junction of resistors 156 and 158 is coupled to the collector of transistor 144 by means of a coupling capacitor 160 and to the terminal 122 of potentiometer 118 by means of a zener diode 162 in series combination with a resistor 164.

The junction of resistors 154 and 156 is coupled through a protection diode 166 to the base electrode of a transistor 168. The base electrode of transistor 168 is also coupled to terminal 126 of voltage source 124 by means of a resistor 169. The collector electrode of transistor 168 is coupled to reference potential by means of a resistor 170 and to the base electrode of a transistor 172 by means of a resistor 174. The emitter electrode of transistor 172 is coupled to reference potential and the collector electrode of transistor 172 is coupled by means of a series combination of a resistor 176 and a capacitor 178 to the gate electrode of SCR 16. The enabling resistor 106 is coupled between the gate electrode and the anode electrode of SCR 16. The collector electrode of transistor 172 is also coupled through a series combination of a resistor 180 and a resistor 182 to terminal 126 of voltage source 124.

A limiting network 184 provides for clamping of the voltage at the collector electrode of transistor 172 to approximately reference potential when the voltage pulse at the junction of windings 84c and 84d exceeds a predetermined amplitude. The junction of windings 84c and 84d is coupled through a series combination of a zener diode 186 and a resistor 188 to reference potential. The anode electrode of zener diode 186 is coupled to the junction of windings 84c and 84d. A series combination of a resistor 190 and a resistor 192 is coupled between terminal 126 of voltage source 124 and reference potential. The anode electrode of a blocking diode 194 is coupled to the junction of zener diode 186 and resistor 188, and the cathode electrode is coupled to the junction of resistors 190 and 192. The junction of resistors 190 and 192 is also coupled by means of a series combination of a capacitor 196 and a resistor 198 to the gate electrode of an SCR 200. The junction of capacitor 196 and resistor 198 is coupled through resistor 202 to reference potential. The anode electrode of SCR 200 is coupled to the junction of resistors 180 and 182. The cathode electrode of SCR 200 is coupled to reference potential.

In operation it will be assumed that B+ has been applied to the deflection circuit 10 for a period prior to $t_0$ which is sufficient to stabilize the operation of deflection circuit 10. At $t_0$, the horizontal oscillator 40 produces a positive voltage pulse at output terminal 42 and the gate electrode of SCR 22. This pulse initiates conduction of SCR 22 as shown in FIG. 2B. With SCR 22 in conduction current flows from B+ through diode 14, current limiting resistor 18, winding 20a and SCR 22 to reference potential. Also, current flows through SCR 22 as a result of the discharge of commutating capacitors 48 and 50. The increase in current flow through winding 20a is shown in FIG. 2D. The current flow through SCR 22 produced by commutating capacitors 48 and 50 reduces the current flow through SCR 52 until SCR 52 turns off. As the commutating capacitors 48 and 50 resonate with commutating inductor 46, deflection network 74, winding 84a and capacitor 82, the current through SCR 22 decreases until diode 24 goes into conduction, thereby cutting off the conduction of SCR 22. During the period of conduction of commutating switch 26 ($t_0 - t_1$), a pulse is developed as shown in FIG. 2C at the terminal of winding 84b coupled to high voltage multiplier and rectifier 94, at the terminal of winding 84c coupled to resistor 108 and at the junction of windings 84c and 84d. Also, an inverted version of the pulse shown in FIG. 2C is developed at the terminal of winding 84e coupled to voltage source 124.

As the current decreases through the diode 24, the current flowing through deflection network 74 and capacitor 82 and winding 84a begins to flow through diode 62. During the commutating interval $t_0 - t_1$, it can be seen that the current through diode 14, resistor 18 and winding 20a continues to increase as shown in FIG. 2D. At $t_1$, the commutating interval ends and the voltage at the anode of SCR 22 increases as shown in FIG.

2B. The voltage at the anode of SCR 22 provides for the charging of commutating capacitors 48 and 50 through trace switch 64. As can be seen in FIG. 2B, the voltage at the anode of SCR 22 increases as the commutating capacitors 48 and 50 increase in charge during the first portion ($t_1 - t_2$) of the energy storage interval ($t_1 - t_0'$). Also, the current through diode 14, resistor 18 and winding 20a as shown in FIG. 2D decreases during the interval $t_1 - t_2$.

When the voltage at the anode of SCR 22 increases at $t_1$, a voltage which has a magnitude determined by the zener diode 132 shown in FIG. 2F is developed at the junction of resistor 128 and 130. The voltage at the junction of resistors 128 and 130 is differentiated by means of capacitor 134 in combination with capacitor 138 and resistors 140 and 142. This differentiated waveform as shown in FIG. 2G appears at the base electrode of transistor 144 and provides for saturation of the transistor 144 for a short duration of time after $t_1$. The saturation of transistor 144 discharges integrating capacitor 152 as shown in FIG. 2H (waveform of the voltage at the collector of transistor 144).

The pulse developed by winding 84c as shown in FIG. 2C is rectified by means of diode 110 and integrated by means of capacitor 112. The voltage across capacitor 112 is coupled to the junction of resistor 116 and the resistive element of potentiometer 118.

The direct current that flows from the high voltage multiplier and rectifier 94 into the ultor electrode of the kinescope tube (not shown) flows through the resistors 90 and 92 and produces a negative potential at the junction of resistors 90 and 92 which is coupled to the junction of capacitor 120 and the resistive element of potentiometer 118.

The voltage at terminal 122 of potentiometer 118 is, therefore, a function of B+ coupled to resistor 116, the magnitude of the pulse developed by winding 84c, and the current into the ultor electrode of the kinescope tube. The voltage at terminal 122 is reduced by an amount equal to the voltage drop across resistor 164 and the zener voltage of zener diode 162 and provides for a voltage across resistor 158 which is a function of B+, the voltage pulse produced by winding 84c, and the current into the ultor electrode of the kinescope tube.

At $t_1$, the saturation of transistor 144, which is coupled to the junction of resistors 156 and 158 by means of capacitor 160, reduces the voltage at the junction of resistors 156 and 158 as shown in FIG. 2I to a point which provides for a voltage at the junction of resistors 154 and 156 which produce base-emitter current in the transistor 168 resulting in saturation of transistor 168. Saturation of transistor 168 produces a voltage across resistor 170 approximately equal to the voltage produced by the voltage source 124. The voltage across resistor 170 produces base-emitter current in the transistor 172 by way of resistor 174. The base-emitter current flow through the transistor 172 produces saturation of transistor 172 thereby reducing the voltage at the collector of transistor 172 to zero volts as shown in FIG. 2J and at the gate electrode of SCR 16 as shown in FIG. 2K by an amount approximately equal to the voltage produced by the voltage source 124.

During the interval $t_1 - t_2$, the commutating capacitors 48 and 50 continue to charge through diode 14, resistor 18, winding 20a, commutating inductor 46 and trace switch 64. Also, integrating capacitor 152 charges toward the voltage at terminal 126 of voltage source 124 through resistor 150. In addition, capacitor 178 coupled to the gate of SCR 16 charges as shown in FIG. 2K thereby reducing the reverse bias on the gate-cathode junction of SCR 16.

At $t_2$, the current through diode 14 is decreased to zero as shown in FIG. 2D, and the voltage at the anode of SCR 16 increases as shown in FIG. 2E, thereby producing a transition in the voltage appearing at the gate of SCR 16 as shown in FIG. 2K because of enabling resistor 106. However, since transistor 172 remains in saturation and the time constant of resistor 176 and capacitor 178 is long as compared to the energy storage interval ($t_1 - t_0'$), the transition of the voltage at the gate electrode of SCR 16 is not sufficient to forward bias the gate-cathode junction of SCR 16.

As the capacitor 152 continues to charge, the voltage at the junction of resistors 156 and 158 increases until at $t_3$ the voltage at the junction of resistors 154 and 156 provides for cut-off of transistor 168 and a resultant cut-off of transistor 172. The positive transition at the collector of transistor 172 produces a positive transition at the gate electrode of SCR 16 as shown in FIG. 2K at $t_3$. This positive transition at the gate electrode of SCR 16 forward biases the gate-cathode junction of SCR 16 and places SCR 16 in conduction.

When SCR 16 conducts, the voltage at the anode electrode of SCR 16 reduces to B+ as shown in FIG. 2E at $t_3$, and current begins to flow from commutating capacitors 48 and 50 through commutating inductor 46, winding 20a, resistor 18 and SCR 16 to B+, as shown in FIG. 2D. This current flow from commutating capacitors 48 and 50 reduces the charge on capacitors 48 and 50 as shown in FIG. 2B, thereby providing a charge on capacitors 48 and 50 which will develop the desired pulse amplitude on windings 84b, 84c, 84d and 84e.

The dashed curve shown in FIGS. 2B, 2D, 2E, 2I, 2J and 2K show the performance of the deflection system 10 with reduced B+.

It will be noted in FIG. 2I that the reduction in B+ results in a reduction of the voltage at the junction of resistors 156 and 158, thereby shifting the point at which transistors 168 and 172 cut off to $t_4$. By shifting the point at which transistors 168 and 172 cut off, the point at which SCR 16 is turned on is delayed to $t_4$. The delay of the turn-on of SCR 16 decreases the time interval over which commutating capacitors 48 and 50 can be discharged as shown in FIG. 2B. Since the commutating capacitors 48 and 50 are discharged less with a reduced B+, the voltage at terminal 96 of high voltage multiplier and rectifier 94 and the deflection current through deflection network 74 are maintained relatively constant with variations in B+.

In case of a malfunction of the regulator network comprising bias network 98, ramp generator 100, threshold network 102 and disabling network 104, the gate-cathode junction of SCR 16 would be forward biased by means of enabling resistor 106 at $t_2$. The enabling of conduction of SCR 16 at $t_2$ provides for maximum discharge of commutating capacitors 48 and 50 during the second portion ($t_3 - t_0'$) of the energy storage interval $t_1 - t_0'$, thereby insuring a minimum voltage produced at terminal 96 of high voltage multiplier and rectifier 94 with malfunction of the regulator.

In order to provide for a limiting of the voltage at terminal 96 of high voltage multiplier and rectifier 94, the junction of windings 84c and 84d is coupled to limiting network 184. When the pulse at the junction of windings 84c and 84d exceeds the breakdown voltage of the zener diode 186, a voltage is developed across resistor 188. The voltage across resistor 188 forward biases the diode 194 and increases the voltage at the junction of resistors 190 and 192. This increase in voltage at the junction of resistors 190 and 192 is coupled by means of capacitor 196 and resistor 198 to the gate electrode of SCR 200. The current thereby produced in the gate-cathode junction of SCR 200 provides for the initiation of conduction of SCR 200, thereby clamping the voltage at the junction of resistors 180 and 182 to approximately reference potential. With the junction of resistors 180 and 182 clamped to reference potential, the voltage at the collector electrode of transistor 172 remains at approximately reference potential until B+ is removed from the deflection system 10, thereby providing for a turn-off of SCR 200. During the time that the SCR 200 is in saturation and the voltage at the collector of transistor 172 is at approximately reference potential, the SCR 16 is enabled at $t_2$ during each deflection cycle, and the voltage at terminal 96 of high voltage multiplier and rectifier 94 is held at a minimum voltage.

It can therefore be seen that by providing enabling of the reverse current control network 12 by means of an enabling resistor 106 and disabling in response to an output from a regulation network, malfunctions of the regulation network will provide for a minimum high voltage and a safe operation of the television receiver. Also, if desired, the limiting network 184 may be incorporated for providing for a clamping of the high voltage at a safe level for further protection against excessive high voltage.

What is claimed is:

1. A voltage regulator for a deflection system including a commutating network for storing energy during an energy storage interval of each deflection cycle and for supplying said stored energy to a deflection winding and a high voltage transformer during a commutating interval of each deflection cycle, said voltage regulator comprising:
    a direct current voltage source;
    unidirectional current conducting means coupled to said direct current voltage source and said commutating network for providing a path for current flow in a first direction between said direct current voltage source and said commutating network during a first portion of said energy storage interval;
    gate controllable, unidirectional current conducting means coupled to said direct current voltage source and said commutating network for providing a path for current flow in a second direction between said direct current voltage source and said commutating network during a second portion of said energy storage interval after a predetermined level of current flows into a gate electrode of said gate controllable, unidirectional current conducting means;
    enabling means coupled to said gate electrode to provide said predetermined level of gate current during said second portion of said energy storage interval; and
    disabling means coupled to said deflection system and said gate electrode for diverting said predetermined level of gate current away from said gate electrode for an interval determined by the level of signals produced by said high voltage transformer thereby maintaining a substantially constant level of signals produced by said high voltage transformer from one deflection cycle to another.

2. A voltage regulator for a deflection system according to claim 1 wherein said disabling means includes:
    bias means coupled to said high voltage transformer for providing a bias signal having a level responsive to said level of signals produced by said high voltage transformer;
    ramp generating means coupled to said deflection system for providing a ramp signal which is reset to a predetermined level upon initiation of said commutating interval; and
    threshold means coupled to said bias means and said ramp generating means for providing a path for the diversion of said predetermined level of gate current when the combined bias signal and ramp signal is within a given range of signal levels.

3. A voltage regulator for a deflection system according to claim 2 wherein said bias means is further coupled to said direct current voltage source for modulating said bias signal in response to changes of said direct current voltage.

4. A voltage regulator for a deflection system according to claim 3 wherein said gate controllable, uni-directional current conducting means is a silicon controlled rectifier.

5. A voltage regulator for a deflection system according to claim 4 wherein said enabling means is a resistor coupled between said gate electrode and an anode electrode of said silicon controlled rectifier.

6. A voltage regulator for a deflection system according to claim 5 wherein said deflection system further includes:
    high voltage rectifying means coupled to said high voltage transformer for providing a source of high voltage direct current;
    a load impedance coupled to said high voltage rectifying means; and
    means coupled to said high voltage rectifying means and said bias means for modulating said bias signal in response to current being produced in said load impedance.

7. A voltage regulator for a deflection system including a commutating network for storing energy during an energy storage interval of each deflection cycle and for supplying said stored energy to a deflection winding and a high voltage transformer during a commutating interval of each deflection cycle, said voltage regulator comprising:
    a direct current voltage source;
    unidirectional current conducting means coupled to said direct current voltage source and said commutating network for providing a path for current flow in a first direction between said direct current voltage source and said commutating network during a first portion of said energy storage interval;
    gate controllable, unidirectional current conducting means coupled to said direct current voltage source and said commutating network for providing a path for current flow in a second direction between said direct current voltage source and said commutating network during a second portion of said energy storage interval after a predetermined level of current flows into a gate electrode of said gate controllable, unidirectional current conducting means;
    enabling means coupled to said gate electrode to provide said predetermined level of gate current during said second portion of said energy storage interval;

disabling means coupled to said deflection system and said gate electrode for diverting said predetermined level of gate current away from said gate electrode for an interval determined by a level of signals produced by said high voltage transformer thereby maintaining a substantially constant level of signals produced by said high voltage transformer from one deflection cycle to another; and limiting means coupled to said high voltage transformer and said disabling means for rendering said disabling means inoperative when said level of signals produced by said high voltage transformer exceeds a predetermined level.

8. A voltage regulator for a deflection system according to claim 7 wherein said disabling means includes:

bias means coupled to said high voltage transformer for providing a bias signal having a level responsive to said level of signals produced by said high voltage transformer;

ramp generating means coupled to said deflection system for providing a ramp signal which is reset to a predetermined level upon initiation of said commutating interval; and threshold means coupled to said bias means and said ramp generating means for providing a path for the diversion of said predetermined level of gate current when the combined bias signal and ramp signal is within a given range of signal levels.

9. A voltage regulator for a deflection system according to claim 8 wherein said bias means is further coupled to said direct current voltage source for modulating said bias signal in response to changes of said direct current voltage.

10. A voltage regulator for a deflection system according to claim 9 wherein said gate controllable, unidirectional current conducting means is a silicon controlled rectifier.

11. A voltage regulator for a deflection system according to claim 10 wherein said enabling means is a resistor coupled between said gate electrode and an anode electrode of said silicon controlled rectifier.

12. A voltage regulator for a deflection system according to claim 11 wherein said deflection system further includes:

high voltage rectifying means coupled to said high voltage transformer for providing a source of high voltage direct current;

a load impedance coupled to said high voltage rectifying means; and means coupled to said high voltage rectifying means and said bias means for modulating said bias signal in response to current being produced in said load impedance.

* * * * *